United States Patent [19]

Oguri

[11] 4,099,139
[45] Jul. 4, 1978

[54] POWER AMPLIFIER CIRCUIT

[75] Inventor: Kenro Oguri, Hamamatsu, Japan

[73] Assignee: Nippon Gakki Seizo Kabushiki Kaisha, Hamamatsu, Japan

[21] Appl. No.: 766,593

[22] Filed: Feb. 8, 1977

[30] Foreign Application Priority Data

Feb. 10, 1976 [JP] Japan .................................. 51-12883

[51] Int. Cl.² .............................................. H03F 3/04
[52] U.S. Cl. ................................ 330/298; 330/207 P; 330/267; 330/296
[58] Field of Search ................... 330/199, 207 P, 263, 330/267, 296, 298

[56] References Cited

U.S. PATENT DOCUMENTS 3,553,599  1/1971  Hayamizu .......................... 330/22 X
3,896,393  7/1975  Cave et al. ............................ 330/22

Primary Examiner—Lawrence J. Dahl
Attorney, Agent, or Firm—Cushman, Darby & Cushman

[57] ABSTRACT

A power amplifier circuit comprising a voltage amplifier stage and a current amplifier stage, the mode of bias of which can be changed over between class A and class B (AB). The supply voltage for the current amplifier stage is changed over by a mode selection switch. The change in the supply voltage is detected to select the bias voltage for the current amplifier stage.

The possibility of applying a class A bias to the current amplifier stage supplied with a class B line voltage is thus completely removed.

6 Claims, 5 Drawing Figures

POWER AMPLIFIER CIRCUIT

BACKGROUND OF THE INVENTION (a) Field of the invention:

This invention relates to a power amplifier circuit adapted for use in stereo sets, etc. and more particularly to a final stage current amplifier capable of changing the operation mode between class B (or AB) and class A.

(b) Description of the Prior art:

The operational (bias) mode of an audio amplifier is usually class A or class B (or AB). The class A amplifier has an advantage that the distortion is small but a disadvantage that the efficiency is low, while the class B amplifier has the advantage and the disadvantage of the opposite nature. When a higher efficiency is desired, as is usually the case for a power amplifier, a class B push-pull circuit is usually adopted. In the class B push-pull circuit, however, distortion inevitably exists to some extent in the output signal. Such distortion becomes especially noticeable in the small signal range due to the basic principle of the class B amplifier. However, if the mode of bias can be changed over between class B and class A, a wider range of demands can be satisfied. Namely, a power amplifier can work in class B mode when a higher output power is demanded, and also in class A mode when the output signal of higher quality is demanded even if the maximum output power is reduced.

Examples of such mode-changeable power amplifiers are proposed in Japanese Patent Laid-Open Application Nos. 49-91567 and 49-91568. In the power amplifier of Japanese Patent Laid-Open Application No. 49-91567, a switch for changing over the bias voltage is provided in the circuit for setting the bias voltage for the amplifying transistor of the final stage current amplifier circuit. The bias point of the final stage current amplifier is changed by this change-over switch, thereby changing the mode of bias. According to this structure, however, the length of the wiring between the bias change-over switch and the bias setting circuit becomes long and thereby the output signal is easily influenced by the external noises. Further, the wiring operation may become complicated. Yet further, since the bias change-over switch is operated externally and has a mechanical contact, there may arise poor electrical connection at the contact.

In the power amplifier circuit of Japanese Patent Laid-Open Application No. 49-91568, a bias change-over switch is provided in the bias setting circuit for the amplifying transistor to change-over the bias voltage and hence the operation mode (class) of the final stage amplifier circuit, similar to the amplifier circuit of Japanese Patent Laid-Open Application No. 49-91567, and further a switch interlocked with the bias change-over switch is provided for changing over the supply voltage for the final stage current amplifier circuit.

Generally, in a class A amplifier, the bias point is set at a middle point of the load line, and hence a relatively large idling current is allowed to flow through the transistor. Therefore, there is a need for reducing the supply voltage for the final stage amplifier in the class A operation to a fraction of that in the class B operation. Considering this point, a switch for changing over the supply voltage is provided in this circuit.

Interlocking the bias and supply voltage change over switches, however, cannot completely prevent from flowing in the amplifying transistor in the final stage. Such excess current may cause damage or deterioration of the characteristic of the transistor. More specifically, a considerably large capacitance is usually connected to the supply voltage line and/or the power source circuit. Thus, even when the supply voltage change-over switch is changed over, the supply voltage itself does not change rapidly. When the operation mode of the final stage amplifier is changed over from class B to class A, the biasing voltage may be changed over to a high level in accordance with the class A operation before the supply voltage decreases to a required value. An excess idling current thus flows to possibly damage the amplifying transistor of the final stage current amplifier circuit. To avoid such disadvantages, a time lag may be given to the actuation time of the bias change-over switch and that of the supply voltage change-over switch. This, however, leads to a complicated structure. Further, since the rising or falling time of the supply voltage may vary over in a wide range depending on the operation timing and the successive operations, it is not easy to realize a switch satisfying these conditions. Further, drawbacks met in the foregoing example still exist in this example.

SUMMARY OF THE INVENTION

Therefore, an object of this invention is to provide a power amplifier circuit capable of changing the mode of bias and of eliminating the conventional drawbacks.

According to an aspect of this invention, there is provided in a power amplifier circuit a switch means for changing over the supply voltage for the final stage current amplifier circuit in coincidence with the selected operation mode, a voltage detection means for detecting the supply voltage and a bias setting means for setting the bias for the final stage power amplifier in response to the supply voltage on the basis of the output of this voltage detection means so that the bias for the final stage current amplifier circuit is changed over in response to the change in the supply voltage. More particularly, the threshold voltage of the voltage detection means is set slightly above the supply voltage determined for the class A operation. When the mode of bias is changed over from class B to class A, the bias voltage established by the bias setting means is changed over to a value for the class A operation at a moment when the supply voltage has decreased approximately to a value for the class A operation. When the mode of bias is changed over from class A to class B, the bias voltage is changed over to the value for the class B operation when the supply voltage exceeds slightly above the value for the class A operation. Therefore, the possibility of damaging the amplifying transistor of the final stage current amplifier upon changing over the mode of bias is completely eliminated.

Thus, there exists no need for paying particular attention for the timing of change-over of the supply voltage and that of the bias voltage. Further, the bias change-over means is not actuated externally and can be formed of an electronic circuit including no mechanical contact. Thus, the increase in the noise and the wiring operations due to the elongated wiring can be avoided.

Further objects, features and advantages of this invention will become apparent from the following detailed description of the preferred embodiments when taken in conjunction with the accompanying drawings.

DESCRIPTION OF THE PREFERRED EMBODIMENTS

Figure 1:
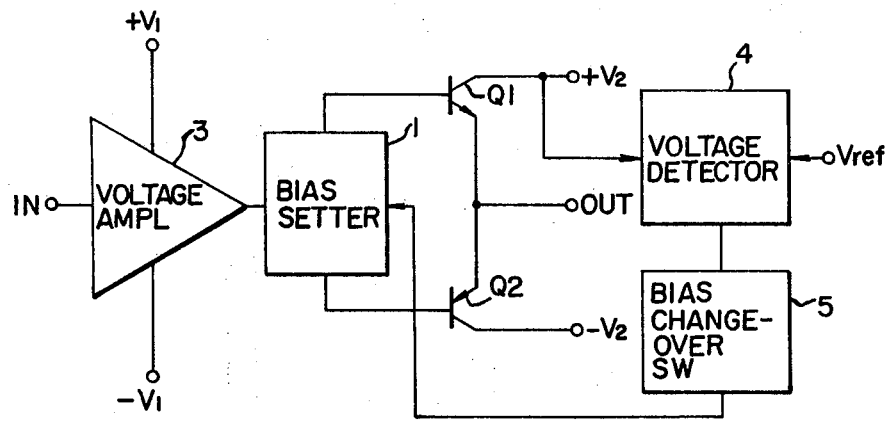
FIG. 1 is a block diagram showing the basic structure of the invention.

FIG. 1 shows the basic structure of the mode-changeable power amplifier circuit of this invention. In the figure, transistors Q1 and Q2 are complementary transistors constituting the final stage current amplifier circuit. The input signal is first voltage-amplified in a voltage amplifier circuit 3 and then supplied to the current amplifying transistors Q1 and Q2 through a bias setting circuit 1. Across the complementary transistors Q1 and Q2, supply voltages $+V_2$ and $-V_2$ are applied. This supply voltage $V_2$ is detected in a voltage detection circuit 4. The detection circuit 4 compares the supply voltage $V_2$ with a reference voltage $V_{ref}$ and controls the bias change-over switching circuit 5. The output of the bias change-over circuit 5 is applied to the bias setting circuit 1 to set an appropriate bias voltage for the amplifying transistors Q1 and Q2. In operation, the supply voltages $+V_2$ and $-V_2$ are changed over with the selection of the mode of bias by some switch means in a power source circuit (not shown). For example, $V_2 = 55V$ for the class B operation and $V_2 = 25V$ for the class A operation. Here, the supply voltage $V_1$ for the voltage amplifier 3 is set constant, e.g. at 60V regardless of the mode of bias. The reference voltage $V_{ref}$ may be any arbitrary constant voltage. The voltage detection circuit 4 has a threshold voltage, e.g. 28V, slightly above the supply voltage for the class A operation, $V_2 = 25V$, based on the reference voltage $V_{ref}$. For example, when the mode of bias was changed from class B to class A and the supply voltage $V_2$ has decreased from 55V to about 28V, the voltage detection circuit 4 generates and supplies a detection signal to the bias change-over circuit 5. The bias change-over circuit 5 is actuated by this detection signal and controls the bias setting circuit 1 to establish a bias voltage of class A mode.

Here, the reference voltage $V_{ref}$ may be generated from the supply voltage $V_1$ for the voltage amplifier circuit 3. Alternatively, the supply voltage $V_1$ for the voltage amplifier circuit 3 may also be arranged to be changed over upon the change of the mode of bias.

Figure 2:
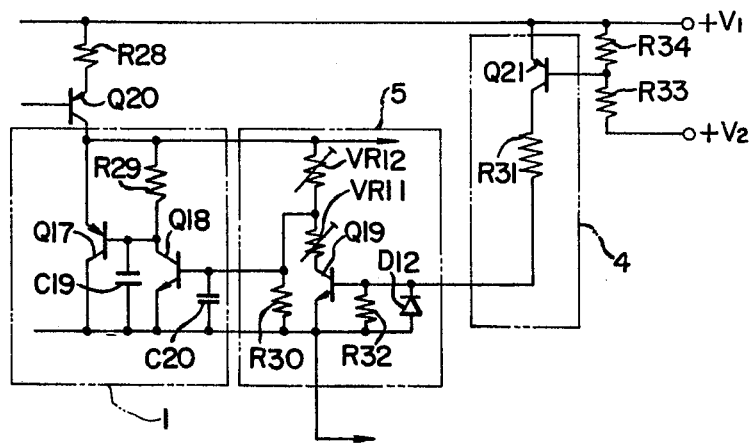
FIG. 2 is a partial circuit diagram of a power amplifier circuit according to an embodiment of this invention.

FIG. 2 shows an embodiment of a power amplifier circuit in which reference numerals similar to those in FIG. 1 denote similar parts. Namely, the voltage detection circuit 4 includes a switching transistor Q21 having a collector connected to a resistor 31. The emitter of transistor Q21 is connected to the supply voltage $V_1$ and the base thereof to the interconnection point of a voltage divider formed of resistors R33 and R34. The bias changeover circuit 5 includes a resistor R32 connected in series with the resistor R31 and a diode D12. A diode D12 is connected in parallel to the resistor R32 to prevent reverse voltage across the resistor R32. In this embodiment, for example, the reference voltage $V_{ref}$ is formed of a supply voltage $V_1 = 60V$ and the supply voltage $V_2$ is changed over between 55V (class B) and 25V (class A). The voltage dividing ratio of the voltage divider circuit is so selected that the transistor Q21 is turned on (off) when the supply voltage $V_2$ decreases below (increases above) a value set slightly above the supply voltage for the class A operation, e.g. at about 28V. The resistors R31 and R32 form the load for the transistor Q21. The voltage at the interconnection point of the resistors R31 and R32 is changed over by the switching action of the transistor Q21 and fed to the bias change-over circuit 5. The bias change-over circuit 5 consists of a variable resistor VR12 and a resistor R30 and a by-pass circuit formed of a variable resistor VR11 and a switching transistor Q19 controlled by the output voltage of the voltage detection circuit 4. Namely, when the transistor Q19 is turned on, the by-pass circuit, that is, the variable resistor VR11 and the transistor Q19 is connected in parallel to the resistor R30. The bias setting circuit 1 includes a pair of Darlington-connected transistors Q18 and Q17, capacitor C19 and C20, and a resistor R29, the latter three elements forming the input circuits for transistors Q17 and Q18. A constant current source circuit formed of a resistor R28 and transistor Q20 is a load for the voltage amplifier 3 in FIG. 1.

When the supply voltage $+V_2$ exceeds the threshold voltage, e.g. 28V, in response to the change-over into the class B operation, the transistor Q21 and hence the transistor Q19 are turned off. Then, the by-pass circuit consisting of the variable resistor VR11 and the switching transistor Q19 is cut off from the voltage dividing circuit of the bias change-over circuit 5. Thus, the base bias voltage for the transistor Q18 of the bias setting circuit 1 is determined by the resistances VR12 and R30 and kept at a high value. Thus, the transistor Q18 is turned on to increase the emitter-base bias of the transistor Q17. The collector-emitter voltage of the transistor Q17 is thereby reduced to a predetermined low value which forms the bias voltage for a current amplifier stage (not shown) of the class B operation.

When the supply voltage $V_2$ is reduced below the threshold value (28V), the transistor Q21 and hence transistor Q19 are turned on and the base bias voltage for the transistor Q18 decreases due to the by-pass circuit of the variable resistor VR11 and the transistor Q19. Then, the transistor Q17 generates a high collector-emitter voltage which forms the bias voltage for the current amplifier stage of the class A operation.

Figure 3:
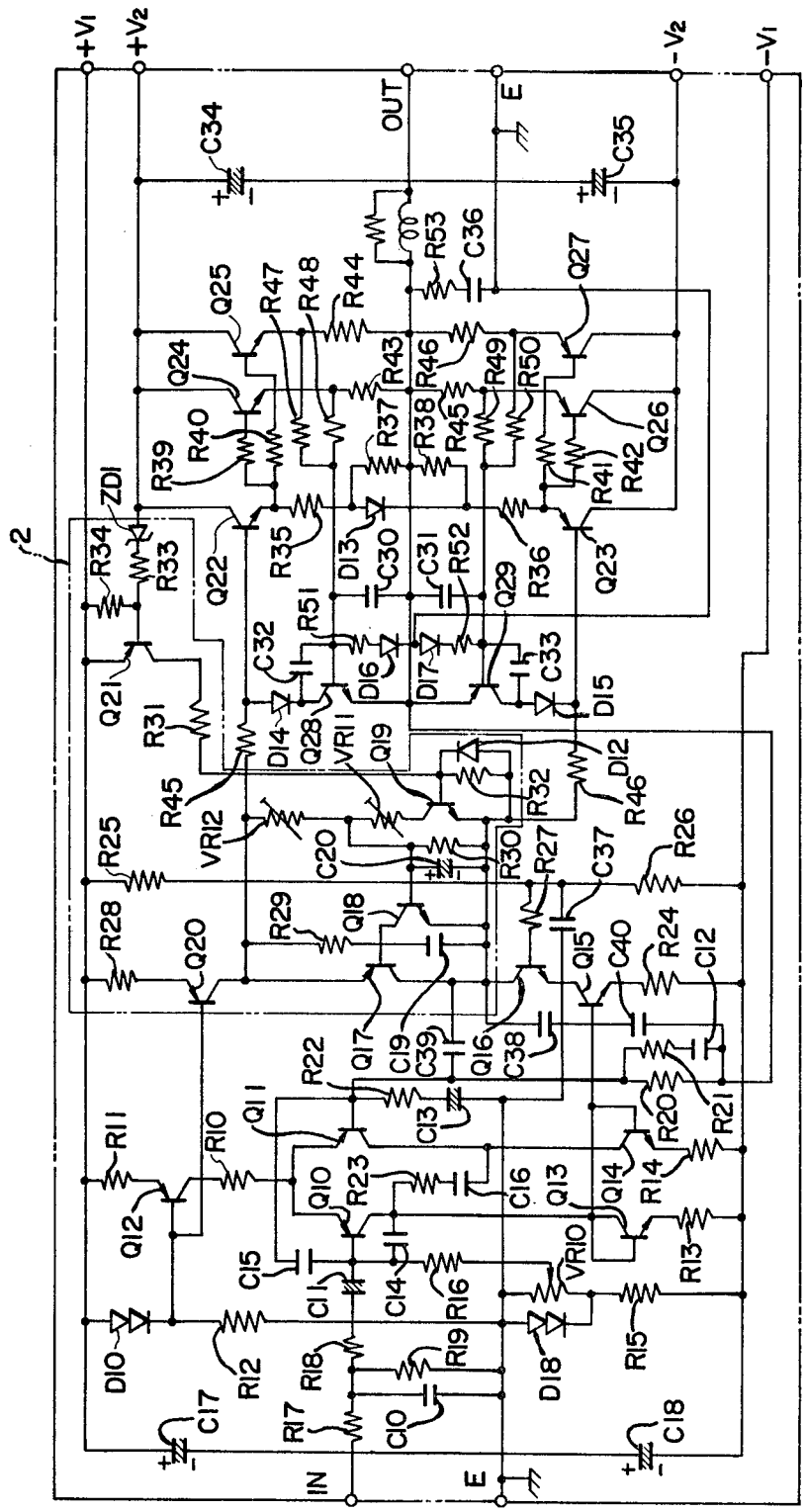
FIG. 3 is a circuit diagram of a power amplifier circuit embodying the structure of FIG. 2.

The bias change-over circuit 5 may be regarded as part of the bias setting circuit 1 when the bias setting circuit 1 is considered as the circuit for establishing an appropriate bias voltage in response to the voltage change in the supply voltage detected in the voltage detector circuit 4. FIG. 3 shows a more complete circuit diagram of a power amplifier circuit embodying the circuit of FIG. 2. In the figure, a block 2 enclosed in a broken line and disposed in a central portion denotes a similar circuit to that of FIG. 2. In this embodiment, a zener diode ZD1 is connected in series with the resistor R33 to compensate for the supply voltage fluctuation and the temperature dependence of the transistor Q21. On the lefthand side, a differential voltage amplifier stage is shown, while on the righthand side a current amplifier stage is shown.

The differential amplifier stage includes a pair of pnp transistors Q10 and Q11 having the emitters connected in common to a line voltage $V_1$ through a constant current circuit consisting of a transistor Q12, resistors R10, R11 and R12, and a pair of series diodes D10. The collectors of the transistors Q10 and Q11 are connected to another line voltage $-V_1$ through respective loads consisting of transistors Q13 and Q14 and resistors R13 and R14. A series circuit of a resistor R15 and a parallel connection of a potentiometer VR10 and a pair of diodes D18 is connected between the ground line E and a line voltage $-V_1$. The slidable contact of the potentiometer VR10 is connected to the base of the transistor Q10 through a resistor R16. The input signal applied to an input terminal IN is applied to the base of the transistor Q10 through an input circuit consisting of resistors R17, R18 and R19 and a capacitor C10 and a coupling capacitor C11. The base of the other transistor Q11 of the differential amplifier is applied with the output of the final stage current amplifier circuit (to be described later) through a feed-back network consisting of resistors R20, R21 and R22 and capacitors C12 and C13. Capacitors C14, C15 and C16 and a resistor R23 are provided for compensating for the phase shift and capacitors C17 and C18 are decoupling capacitors for the voltage lines $+V_1$ and $-V_1$.

The bases of the transistors Q13 and Q14 are connected on one hand to the collector of the transistor Q10 and on the other hand to the base of a transistor Q15. The emitter of this transistor Q15 is connected to the line voltage $-V_1$ through a resistor R24 and the collector thereof is cascode-connected to a transistor Q16 which is applied with a constant bias through resistors R25, R26 and R27.

As has been described above in connection with FIG. 2, transistors Q17 and Q18 form a bias setting circuit and a transistor Q19 forms a bias change-over circuit. The emitter of the transistor Q17 is connected to the line voltage $+V_1$ through a constant current circuit consisting of a resistor R28, the diode pair D10 and a transistor Q20. The collector of the transistor Q17 and the emitters of the transistors Q18 and Q19 are collected to the collector of a transistor Q16. The base of the transistor Q17 is connected to the emitter and the collector of Q19 through a capacitor C19 and resistor R29. The collector of the transistor Q19 is connected to the emitter of the transistor Q17 through variable resistors VR11 and VR12. The interconnection point of the variable resistors VR11 and VR12 is connected to the base of the transistor Q18. Reference numeral R30 is a resistor and C20 a capacitor.

The switching of the transistor Q19 forming the bias change-over circuit is driven by a transistor Q21 which detects the level of a supply voltage $+V_2$ for the final stage power amplifier circuit. The base of the transistor Q19 is connected to the collector of a transistor Q21 through a resistor R31. A resistor R32 is inserted for allowing a leakage current from the transistors Q19 and Q20 to flow and a diode D12 is inserted for preventing a reverse voltage to be applied across the base-emitter of the transistor Q19. The base of the transistor Q21 is biased by a voltage formed by dividing the voltage difference of the supply voltages $+V_1$ and $+V_2$ by resistors R33 and R34. The threshold voltage of switching of the transistor Q21 is so arranged that the transistor Q21 is turned off when the supply voltage $+V_2$ increases above a predetermined voltage (e.g. 28V) selected slightly above the supply voltage for the class A operation (e.g. 25V).

Transistors Q22 and Q23 form a driver stage of a complementary push-pull circuit of common collector type. The collectors of the transistors Q22 and Q23 are connected to the lines of the supply voltages $+V_2$ and $-V_2$ and the emitters thereof are connected to each other through resistors R35 and R36 and a diode D13. The two electrodes of the diode D13 are connected to the output line OUT through resistors R37 and R38. The emitters of the complementary transistors Q22 and Q23 are resistance-coupled to the bases of transistors Q24, Q25, Q26 and Q27 of the final current amplifier circuit through resistors R39, R40, R41 and R42. Pairs of transistors Q24 - Q25 and Q26 - Q27 are operated in parallel, respectively. The emitters of the transistors Q24, Q25, Q26 and Q27 are connected to the output line OUT through resistors R43, R44, R45 and R46. The collectors of these transistors Q24, Q25, Q26 and Q27 are connected to the lines of the supply voltage $+V_2$ and $-V_2$. This current amplifier circuit has a complementary single-ended push-pull circuit structure of the common emitter connection comprising pairs of complementary transistors connected in parallel.

The collector and the emitter of the transistor Q17 of the bias setting circuit are connected through resistors R45 and R46 to the bases of the driver transistors Q22 and Q23 which establish the base bias voltages for the amplifying transistors Q24 to Q27.

Transistors Q28 and Q29 form a protection circuit for the transistors Q24, Q25, Q26 and Q27 of the final stage current amplifier circuit. When an excess current is allowed to flow through any one of the transistors Q24 to Q27, the corresponding transitor Q28 or Q29 is turned on to ground the base of the driver transistor Q22 or Q23. The emitters of the transistors Q28 and Q29 are connected to the output line OUT and the collectors thereof to the bases of the transistors Q22 and Q23 through diodes D14 and D15. The bases of the transistors Q28 and Q29 are connected through respective resistors R47, R48, R49 and R50 to the emitters of the transistors Q24, Q25, Q26 and Q27 and also through capacitors C30 and C31 to the output line OUT. The bases of the transistors Q28 and Q29 are also connected through capacitors C32 and C33 to the collectors thereof and through resistors R51 and R52 and diodes D16 and D17 to the ground line. In the figure, references C34 to C40 denote capacitors and R53 a resistor.

Figure 4:
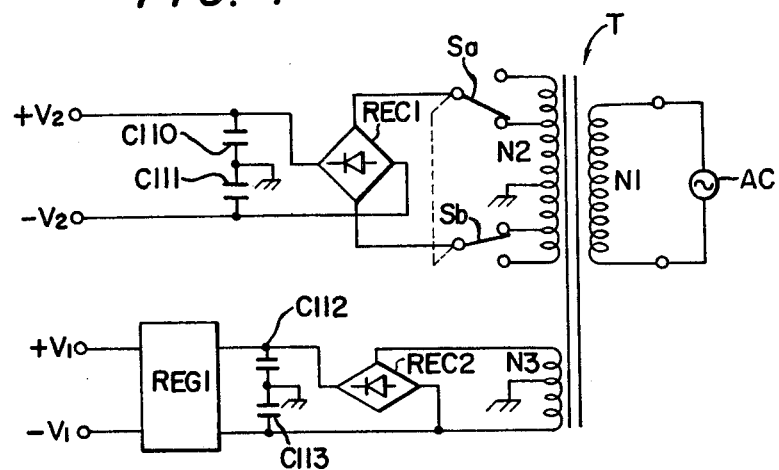
FIG. 4 is a circuit diagram of a power source circuit for generating supply voltages for the circuit of FIG. 3.

FIG. 4 shows a power source circuit for supplying line voltages $+V_1$, $-V_1$, $+V_2$ and $-V_2$ for the circuit of FIG. 3, provided with a change-over switch for selecting the voltage of $+V_2$ and $-V_2$. A commercial ac power source is connected to the primary winding N1 of a transformer T, the secondary winding N2 of which has two pairs of output terminals. Either one pair of the terminals is selected by interlocked switches Sa and Sb (supply voltage selection switch) and connected to a rectifier circuit REC1. Namely, the value of the ac input voltage for the rectifier REC1 can be changed over by selecting a pair of end terminals or intermediate terminals of the secondary winding N2 through the switches Sa and Sb. Another secondary winding N3 is provided in the transformer T and connected to another rectifier REC2 to generate another pair of line voltages $\pm V_1$ which is supplied through filter capacitors C112 and C113 and a voltage regulator REG1.

The operation of the circuit of FIG. 3 provided with the power source circuit of FIG. 4 will be described hereinbelow.

Input signal supplied to the input terminal IN is first voltage-amplified in the differential amplifier including the transistors Q10 and Q11, and the amplifier including the transistors Q15 and Q16, and then sent to the driver transistors Q22 and Q23 through the bias setting circuit including the transistors Q17 and Q18. The driver transistors Q22 and Q23 drive the transistors Q24, Q25, Q26 and Q27 of the final stage power amplifier to supply the output to the output terminal OUT.

The selection of the base bias for the transistors Q24, Q25, Q26 and Q27 will be described hereinbelow. When the supply voltage selection switch Sa and Sb is changed over to high voltage side (end taps) of the secondary winding N2 of the transformer T to supply the line voltages $+V_2$ and $-V_2$ for the class B operation (e.g. 55V), the transistor Q21 of the voltage detection circuit is turned off. Then, the transistor Q19 of the bias change-over circuit is turned off. The transistors Q17 and Q18 of the bias setting circuit are biased by a voltage formed by dividing the emitter-collector voltage of the transistor Q17 at a ratio given by the variable resistor VR12 and the resistor R30, i.e. R30/(VR12 + R30). Here, the variable resistor VR12 may be adjusted to control the voltage applied to the transistors Q17 and Q18 thereby to set the bias for the final stage current amplifier and let the transistors Q24, Q25, Q26 and Q27 operate in the class B mode. Next, when the supply voltage selection switch Sa and Sb is changed over to the low voltage side (intermediate taps) of the secondary winding N2 of the transformer T, the supply voltage $+V_2$ and $-V_2$ decreases toward the value for the class A operation (e.g. 25V). When it crosses the threshold voltage, for example 28V, the transistor Q21 of the voltage detector circuit is turned on and hence the transistor Q19 of the bias change-over circuit is turned on. Then, the voltage divider is now formed of the variable resistor VR12 and the parallel connection of the resistor R30 and the variable resistor VR11. The divided voltage is applied across the base-emitter of the transistor Q18. Namely, due to the addition of the variable resistor VR11, the bias voltage for the transistor Q18 becomes deep and hence the emitter-collector voltage of the transistor Q17 increases. Then the bias for the transistors Q24, Q25, Q26 and Q27 of the final stage current amplifier becomes low to let these transistors operate in the class A mode. Here, the bias voltage for the transistors Q24, Q25, Q26 and Q27 may be adjusted by the variable resistor VR11.

The voltage detection circuit 4 and the bias change-over circuit 5 may be electrically isolated from the bias setting circuit 1 by using photocouplers, etc. Further, the supply voltage selection switch may be formed of a combination of a manual switch and a relay. Further, the transistors Q17 and Q18 of the bias setting circuit 1 may be npn- and pnp-types, respectively.

Figure 5:
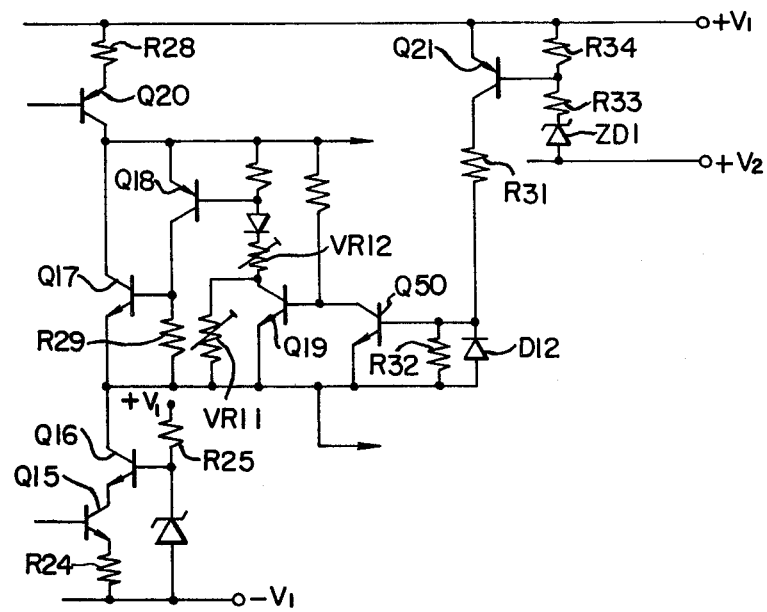
FIG. 5 is a partial circuit diagram of a power amplifier circuit according to another embodiment of this invention.

FIG. 5 shows an alternative structure to that of FIG. 2, in which transistors Q17 and Q18 are npn- and pnp-types, respectively. In the figure, a transistor Q50 is added for inverting the phase. Other parts are similar to those of FIGS. 2 and 3 and denoted by similar reference numerals to those of FIGS. 2 and 3. According to this structure, the bias setting operation may be enhanced to some extent due to the addition of the transistor Q50 before the transistor Q19.

According to the mode-changeable power amplifier of this invention, only the supply voltage for the final stage amplifier circuit is externally changed over according to the selected mode of bias, and the bias voltage is automatically changed over upon detection of the change in the supply voltage. Therefore, the damage in the transistors of the final stage amplifier circuit can be prevented without the need for the use of switches of complicated structure. Further, the bias change-over means can be formed of a purely electronic circuit without using any mechanical switch. Thus, there is no fear of causing poor electrical contact in the circuit. Further, since the bias change-over means can be integrally combined with other circuitries, long wirings are not necessary and thereby noises can be reduced.

I claim:

1. In a dual operational mode power amplifier of the type comprising a voltage amplifier, a current amplifier receptive at an input port of signals from said voltage amplifier, and change over means for selectively changing the voltage supply level and bias condition of said current amplifier to establish thereby the operational mode of said power amplifier, the improvement wherein said change over means comprises:
   means for detecting the level of said current amplifier supply voltage level and generating a signal in accordance with the relative magnitude of said supply voltage level and a reference level; and
   means responsive to said detecting means signal for establishing said current amplifier bias condition, such that changes in said biasing are effected only when said supply voltage level is in predetermined relation to said reference level, whereby excess currents in said current amplifier are avoided.

2. The power amplifier according to claim 6, wherein said voltage detector means includes a voltage divider, receptive of a signal indicative of said supply voltage, for generating a divided voltage therefrom in accordance with a predetermined ratio of resistances and a first switching element connected to said voltage divider and controlled by the divided voltage.

3. The power amplifier according to claim 6, wherein said means for establishing said bias includes a voltage divider coupled to said current amplifier input port, said voltage divider being provided with a by-pass circuit, the by-pass circuit including a series connection of a resistance element and a second switching element, the second switching element being controlled by said detector means signal, to selectively couple said resistance element into said voltage divider.

4. The power amplifier of claim 1, wherein said means for establishing said bias includes a second voltage divider coupled to said current amplifier input port, said second voltage divider being provided with a by-pass circuit, the by-pass circuit including a series connection of a resistance element and a second switching element, the second switching element being controlled by said detector means signal to selectively couple said resistance element into a voltage divider.

5. The power amplifier of claim 4 wherein said first and second switching elements comprises first and second transistors respectively, each having a first and second electrode defining a current path therebetween and a control electrode for controlling the conduction through said path in accordance with the potential difference between said second and control electrodes,
   said first transistor second electrode being receptive of said signal indicative of said current amplifier supply voltage, and said first control electrode receptive of said divider voltage, said first transistor first electrode being coupled to a further resistance element and controllably developing a voltage thereacross, said second transistor control and said electrodes being connected across said further resistance element whereby conduction of said second transistor is controlled by said developed voltage.

6. The power amplifier circuit of claim 5 wherein said voltage amplifier includes a load and said bias establishing means further includes a pair of Darlington-connected transistors, said Darlington pair being receptive of current flowing through said load and responsive to said second voltage divider output signal.

* * * * *

UNITED STATES PATENT AND TRADEMARK OFFICE
CERTIFICATE OF CORRECTION

PATENT NO. : 4,099,139
DATED : July 4, 1978
INVENTOR(S) : OGURI, Kenro

It is certified that error appears in the above-identified patent and that said Letters Patent are hereby corrected as shown below:

Column 1, line 67, after "prevent" insert --an excess current--
Column 3, line 66, after "D12" delete ". A diode"
Column 3, line 67, delete "D12"
Column 8:

Claim 2, line 31, change "6" to --1--
             line 32, change "detector" to --detecting--
             line 32, after "a" insert --first--
    Claim 3, line 38, change "6" to --1--
             line 45, change "tector" to --tecting--
    Claim 4, line 47, change "1" to --2--
             line 54, change "detector" to --detecting--
             line 55, change "a" to --said second--

Column 9, line 4, before "electrodes" insert --second--

Signed and Sealed this

Second Day of October 1979

[SEAL]

Attest:

RUTH C. MASON
*Attesting Officer*

LUTRELLE F. PARKER
*Acting Commissioner of Patents and Trademarks*